US007462774B2

(12) United States Patent
Roscheisen et al.

(10) Patent No.: US 7,462,774 B2
(45) Date of Patent: *Dec. 9, 2008

(54) PHOTOVOLTAIC DEVICES FABRICATED FROM INSULATING NANOSTRUCTURED TEMPLATE

(75) Inventors: Martin R. Roscheisen, San Francisco, CA (US); Brian M. Sager, Palo Alto, CA (US); Karl Pichler, Santa Clara, CA (US)

(73) Assignee: Nanosolar, Inc., Palo Alto, CA (US)

( * ) Notice: Subject to any disclaimer, the term of this patent is extended or adjusted under 35 U.S.C. 154(b) by 756 days.

This patent is subject to a terminal disclaimer.

(21) Appl. No.: 10/771,250

(22) Filed: Feb. 2, 2004

(65) Prior Publication Data

US 2005/0098205 A1    May 12, 2005

Related U.S. Application Data

(63) Continuation-in-part of application No. 10/443,456, filed on May 21, 2003, now Pat. No. 6,946,597.

(51) Int. Cl.
*H01L 31/00* (2006.01)
*H02N 6/00* (2006.01)
(52) U.S. Cl. .................................. 136/256; 136/244
(58) Field of Classification Search .............. 136/255, 136/256, 263, 252
See application file for complete search history.

(56) References Cited

U.S. PATENT DOCUMENTS 4,499,658 A    2/1985    Lewis (Continued)

FOREIGN PATENT DOCUMENTS

DE    2741954    3/1979

(Continued)

OTHER PUBLICATIONS

Pierson, et al. (Handbook of Chemical Vapor Deposition (CVD): Principles, Technology, and Applicantions, William Andrew Publishing, New York, USA, Copyright 1999, p. 310.*

(Continued)

*Primary Examiner*—Alexa D. Neckel
*Assistant Examiner*—Shannon Gardner
(74) *Attorney, Agent, or Firm*—Joshua D. Isenberg; JDI Patent

(57) ABSTRACT

Photovoltaic devices, such as solar cells, and methods for their manufacture are disclosed. A device may be characterized by an architecture with an inorganic insulating nanostructured template having template elements between about 1 nm and about 500 nm in diameter with a elements density of between about $10^{12}$ elements/m$^2$ and about $10^{16}$ elements/m$^2$. A first charge-transfer material coats the walls of the template elements leaving behind additional space. A second charge-transfer material fills the additional space such that the first and second charge-transfer materials are volumetrically interdigitated. At least one charge transfer material has an absorbance of greater than about $10^3$/cm. The first and second charge-transfer materials have complementary charge transfer properties with respect to each other. A lowest unoccupied molecular orbital (LUMO) or conduction band of the first charge-transfer material is offset from a LUMO or conduction band of the second charge-transfer material by greater than about 0.2 eV. An electrically conductive material may optionally be disposed between the nanostructured template and the first charge-transfer material.

64 Claims, 5 Drawing Sheets

U.S. PATENT DOCUMENTS

| | | | |
|---|---|---|---|
| 4,865,999 | A | 9/1989 | Xi et al. |
| 4,939,050 | A | 7/1990 | Toyosawa et al. |
| 5,571,612 | A | 11/1996 | Motohiro et al. |
| 6,414,235 | B1 | 7/2002 | Luch |
| 6,444,296 | B1 | 9/2002 | Sasaki et al. |
| 6,472,594 | B1 | 10/2002 | Ichinose et al. |
| 6,515,218 | B1 | 2/2003 | Shimizu et al. |
| 6,517,958 | B1 | 2/2003 | Sellinger et al. |
| 6,586,670 | B2 | 7/2003 | Yoshikawa |
| 6,586,764 | B2 | 7/2003 | Buechel et al. |
| 6,706,962 | B2 | 3/2004 | Nelles et al. |
| 6,852,920 | B2 | 2/2005 | Sager et al. |
| 6,936,761 | B2 | 8/2005 | Pichler |
| 6,946,597 | B2 | 9/2005 | Sager et al. |
| 7,247,346 | B1 | 7/2007 | Sager et al. |
| 7,253,017 | B1 | 8/2007 | Roscheisen et al. |
| 7,291,782 | B2 | 11/2007 | Sager et al. |
| 2002/0017656 | A1 | 2/2002 | Graetzel et al. |
| 2002/0192441 | A1 | 12/2002 | Kalkan et al. |
| 2003/0005955 | A1 | 1/2003 | Shiotsuka et al. |
| 2003/0204038 | A1 | 10/2003 | Xiao et al. |
| 2003/0226498 | A1 | 12/2003 | Alivisatos et al. |
| 2004/0084080 | A1 | 5/2004 | Sager et al. |
| 2004/0103936 | A1 | 6/2004 | Andriessen |
| 2004/0109666 | A1 | 6/2004 | Kim, II |
| 2004/0118448 | A1 | 6/2004 | Scher et al. |
| 2004/0146560 | A1 | 7/2004 | Whitford et al. |
| 2004/0178390 | A1 | 9/2004 | Whitford et al. |
| 2004/0219730 | A1 | 11/2004 | Basol |
| 2004/0250848 | A1 | 12/2004 | Sager et al. |
| 2005/0045874 | A1 | 3/2005 | Xiao et al. |
| 2005/0098204 | A1 | 5/2005 | Roscheisen et al. |
| 2005/0098205 | A1 | 5/2005 | Roscheisen et al. |
| 2005/0121068 | A1 | 6/2005 | Sager et al. |
| 2005/0183767 | A1 | 8/2005 | Yu et al. |
| 2005/0183768 | A1 | 8/2005 | Rocheisen et al. |
| 2005/0206306 | A1 | 9/2005 | Perlo et al. |

FOREIGN PATENT DOCUMENTS

| | | |
|---|---|---|
| JP | 200077691 | 3/2000 |
| WO | WO 02/084708 | 10/2002 |

OTHER PUBLICATIONS

A. P. Li et al. "Polycrystalline Nanopore Arrays with Hexagonal Ordering On Aluminum" 1 J. Vac. Sci. Technol. A, 1428-1431, 17(4) Jul./Aug. 1999.

D. Zhao et al. "Triblock Copolymer Syntheses of Mesoporous Silica with Periodic 50 to 300 Angstrom Pores", Science, 279, 548-552. (1998).

R. Ryoo et al. "Block-Copolymer-Templated Ordered Mesoporous Silica: Array of Uniform Mesopores or Mesopore-Micropore Network?" J. Phys. Chem. B. 104, 11465-11471. (2000).

M.H. Huang et al. "Catalytic Growth of Zinc Oxide Nanowires by Vapor Trasnport" Adv. Mater. 13, 113-116 (Jan. 2001).

M. H. Huang et al. "Ag Nanowire Formation within Mesoporous Silica", Chem. Commun., 2000, 1063-1964.

U.S. Appl. No. 10/419,708 to Martin R. Roscheisen et al, filed Apr. 19, 2003 and entitled "Inter Facial Architecture for Nanostructured Optoelectronic Devices".

U.S. Appl. No. 10/719,041 to Brent J. Bollman et al, filed Nov. 21, 2003 and entitled "Solvent Vapor Infiltration of Organic Materials into Nanostructures".

U.S. Appl. No. 10/338,079 to Martin R. Roscheisen et al., filed on Jan. 6, 2003 and entitlled "Nanostructed Tansparent Conducting Electrode".

\* cited by examiner

200

202 — FORM A NANOSTRUCTURED TEMPLATE HAVING AN ARRAY OF TEMPLATE STRUCTURES DISTRIBUTED IN A SUBSTANTIALLY UNIFORM FASHION

204 — COAT TEMPLATE STRUCTURES WITH CONDUCTIVE MATERIAL (OPTIONAL)

206 — COAT TEMPLATE STRUCTURES WITH $1^{st}$ CHARGE-TRANSFER MATERIAL LEAVING BEHIND ADDITIONAL SPACE

208 — FILL ADDITIONAL SPACE WITH $1^{st}$ AND $2^{nd}$ CHARGE-TRANSFER MATERIAL COMPLEMENTARY TO $1^{st}$

210 — ADD ELECTRODES (OPTIONAL)

212 — ENCAPSULATE (OPTIONAL)

FIG. 2

PHOTOVOLTAIC DEVICES FABRICATED FROM INSULATING NANOSTRUCTURED TEMPLATE

CROSS-REFERENCE TO RELATED APPLICATIONS

This application is a continuation-in-part of and claims priority to commonly assigned U.S. patent application Ser. No. 10/443,456, filed May 21, 2003 now U.S. Pat. No. 6,946,597 the entire disclosures of all of which are incorporated herein by reference.

FIELD OF THE INVENTION

This invention is directed to photovoltaic devices and methods for their production, and more specifically to nanostructured photovoltaic devices.

BACKGROUND OF THE INVENTION

Traditional solar cells harness electricity from light by exploiting the photovoltaic effect that exists at semiconductor junctions, where a semiconductor absorbs light and simultaneously decouples the electric charges ("electrons" and "holes") that arise due to that absorption. However, while these cells have an inherently high stability, to avoid the recombination of electrons and holes prior to their separation, their semiconductors materials must be highly pure and defect-free, resulting in very high fabrication costs (>$300/$m^2$).

Organic and hybrid organic/inorganic solar cells have been described, e.g., in (Shaheen et al. "2.5 Percent Efficient Organic Plastic Solar Cells," Applied Physics Letters 78, 841-843 (2001); Peumans, P. and S. R. Forest. "Very-high efficiency double-heterostructure copper pthalocyanine/C60 photovoltaic cells", Applied Physics Letters 79 (1): 126-128 (2001); Huynh et al., "Hybrid Nanorod-Polymer Solar Cells", Science 295, 2425-2427 (2002); Schmidt-Mende et al., "Self-Organized Discotic Liquid Crystals for High-Efficiency Organic Photovoltaics", Science 293, 1119-1122 (2002)).

In these solar cell devices, however, the device architectures are suboptimal in terms of their nanometer-scale morphology, and improvements are needed to obtain higher-efficiency devices. In particular, the morphology of the active layer of a more optimal device would have an architecture of nanometer scale ordered interdigitation due to the nature of the exciton-based physics. The lifetime of migrating excitons is extremely short, and as such an exciton can typically diffuse only about 10 nm (or at most 10's of nm) before the electron and hole spontaneously (and non-productively) recombine. Thus, to separate the electron away from the hole with which it is bound (and ultimately generate electricity), an exciton must reach the junction to another material (one with higher electron affinity) within 10's of nm of where it was initially created.

In organic and hybrid organic/inorganic solar-cell devices of the prior art, the morphology of the active layer has been quasi-random: Approaches based on blending two or more materials result in a mixture with no control over the exact arrangement of the materials other than that they are intermixed statistically in a targeted ratio. Further, in blended cells, materials can and often do cluster into clumps (that are typically interspersed amongst other areas of too little density). The result of each irregular distribution is suboptimal charge splitting, suboptimal charge transport (via losses due to poor percolation in the electron- and/or hole-transporting materials), and uncertain scalability to thicker cells (as may be required to absorb sufficient amounts for higher efficiencies) or to larger-area cells. Furthermore, in devices of the prior art, the movement of charges through the active materials of the devices required regularly and closely spaced nanoparticles or nanorods that could collect and transport free electrons to the outer boundary of the active layer of the device. The lack of uniform spacing in these devices decreased the device efficiency.

An alternative approach to building an organic solar cell has been developed by Michael Graetzel and his colleagues, who have constructed dye-sensitized, nanocrystalline $TiO_2$ based solar cells using a liquid electrolyte (O'Regan et al. "A Low-cost, High-efficiency solar cell based on dye-sensitized colloidal $TiO_2$ Films", Nature, Vol. 353 pp737-740, 24 October, 1991). Dye-sensitized solar cells (DSSC) disaggregate the processes of light absorption and charge separation. A monolayer of a Ruthenium-based dye that is chemically adsorbed onto a semiconductor surface absorbs light. After having been excited by a photon, the dye injects an electron into a nano-particulate past composed of a semiconductor, $TiO_2$ (titania), upon which the electric field inside the titania allows extraction of the electron. In a parallel process, positive charge is transferred from the dye to a liquid iodide/triiodide-based redox mediator, which allows hole transfer through the solution to a counter electrode, after which the redox mediator is returned to its reduced state, closing the circuit.

Although Graetzel cells can reach 10% efficiency in optimized devices, the only suitable electrolyte (in terms of the speed of the associated redox reaction, etc.) is also highly corrosive. There is no known effective way to seal the cell with the liquid $I^-/I_3$ electrolyte. Even if cell could be effectively sealed, the corrosiveness of the electrolyte is a potential hazard that has discouraged large-scale production of Graetzel cells.

Several approaches have been taken to replace the liquid iodide/triiodide electrolyte with a solid-state material that exhibits sufficient hole transport for efficient device function. These approaches include: (1) Application of ionic conducting polymer gels (Wang et al., 2003), (2) sol-gel nanocomposites containing an ionic liquid (Stathatos et al., 2003), (3) ionic conductors (Cao et al., 1995), (4) inorganic p-type semiconductors, such as CuI or CuSCN (Tennakone et al., 1995; O'Regan and Schwartz, 1998; O'Regan et al., 2003), and (5) low molecular weight organic hole conductors such as 2,2'7,7'tetrakis(N,N-di-p-methoxyphenyl-amine)-9,9'-spirobifluorene(spiro-Me OTAD) (Krüger et al., 2001).

While each of these approaches has succeeded in producing a functional solid-state DSSC, the AM1.5G power conversion efficiency of all of these devices has typically been relatively low, due in part to losses resulting from an irregular titania morphology, which limits the accessible cavities within the tortuously arranged and sintered paste of the nanoparticulate titania, leading to incomplete filling of the solid-state electrolyte material. For example, a DSSC using CuSCN as a solid-state hole conductor showed only 65% filling efficiency for 6-micron thick cells, with the filling efficiency dropping as the cell thickness was increased towards that of a typical DSSC(O'Regan et al, 2003).

Another shortcoming of dye-sensitized solar cells such as Graetzel cell is that a monolayer of dye or pigment such as the ruthenium pigment sensitizes the titania particles. Thus light is typically absorbed only in the monolayer at the surface the $TiO_2$ nanospheres and not in the bulk of the dye or pigment, resulting in lower absorption efficiency per unit volume of the active layer in the solar cell. Further, the absorption spectrum of the ruthenium dye is not fully matched to the irradiance spectrum of sunlight, and this mismatch decreases the potential light absorption from which electrons could be harvested. Taken together, these factors limit the potential efficiency of the current approaches to solid-state DSSC technology.

Thus, there is a need in the art for a solar cell architecture/active-layer morphology that overcomes the above difficulties.

BRIEF DESCRIPTION OF THE DRAWINGS

FIG. 2 is a flow diagram illustrating a method for making a device according to another embodiment of the invention.

DETAILED DESCRIPTION OF THE INVENTION

Figure 1A:
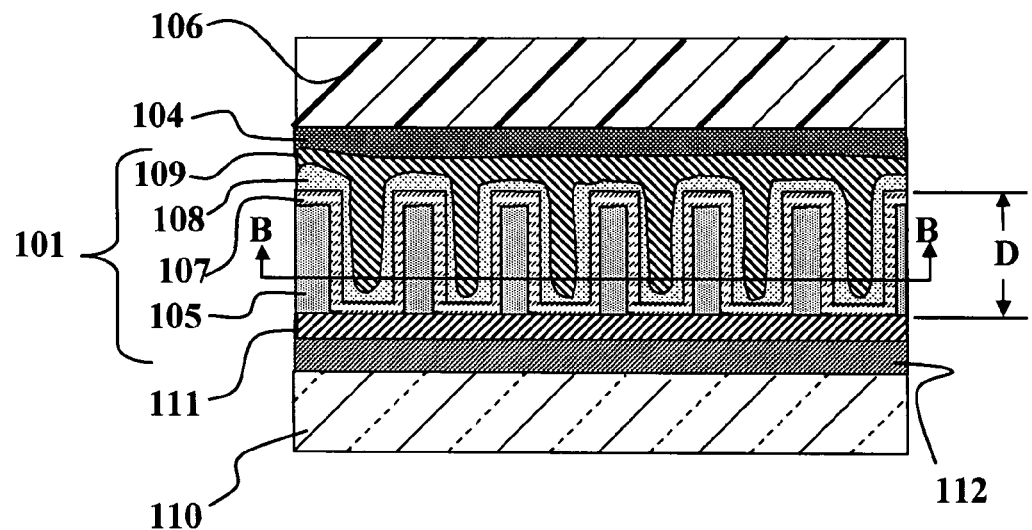
FIG. 1A shows a vertical cross-sectional schematic of a device according to an embodiment of the present invention.

Contents
I. Glossary
II. General Overview
III. Photovoltaic Device
IV. Photovoltaic Device Fabrication
V. Alternative Embodiments
VI. Conclusion I. Glossary The following terms are intended to have the following general meanings as they are used herein:

The article "A", or "An" refers to a quantity of one or more of the item following the article, except where expressly stated otherwise, e.g., "a single" layer.

Active Layer generally refers to the layer within a photovoltaic or solar cell device where conversion of radiant energy to electrical energy takes place.

Anodization refers to the formation of a film, such as an oxide, on a conducting material, such as a metal, by electrolysis.

Array refers to a regular arrangement of objects or structures over a scale of distance greater than some characteristic dimension of a typical structure or object in the array.

Aspect Ratio: refers to the ratio of pore height or depth to pore width.

Band Gap: refers to the energy difference between the HOMO and LUMO levels (or between the conduction valence bands) in a charge transfer material or semiconductor.

Buckminsterfullerene or Fullerene: refers to molecular cages consisting, e.g., of only carbon atoms or mostly carbon atoms. The arrangement of the atoms is almost exclusively in the form of hexagons and pentagons. For example, 12 pentagons and 20 hexagons make a $C_{60}$ cage, which is 10 Å in diameter, with a 4-Å cavity. Fullerenes also have other useful forms, such as $C_{20}$, $C_{36}$, $C_{60}$, $C_{70}$, $C_{76}$, $C_{84}$, etc. Buckminsterfullerene/Fullerenes include derivatives such as doped, functionalized (e.g. COOH or otherwise functionalized, solubilized fullerenes e.g., phenyl-$C_{61}$-butyric acid methyl ester (PCBM), and derivatives thereof, and polymerized fullerenes or combinations thereof as well as fullerene-like molecular cages with or without carbon.

Charge-transfer Material generally refers to a semiconductor, such as a n-type electron acceptor or an p-type hole acceptor.

Column refers to a substantially solid cylinder of material.

Complementary charge-transfer properties: As used herein, a first and second semiconductor materials are said to have complementary charge-transfer properties with respect to each other when the first material is a hole-acceptor and/or hole-transporter with respect to the second and the second is an electron-acceptor and/or electron-transporter with respect to the first or vice versa. Two materials can have complementary charge-transfer properties if they have different electron affinities.

Cone refers to shape having symmetry about an axis and a tapering cross-section.

Cylinder refers to a shape having symmetry about an axis and a substantially constant cross-section.

Device: An assembly or sub-assembly having one or more layers of material.

Efficiency: For an photovoltaic device or active layer, the efficiency is the ratio of energy output (e.g., in the form of electrons) to the necessary energy input (e.g., in the form of photons).

Electrochemical refers to the process of driving a chemical reaction by passing an electric current through a reaction mixture.

Electrolysis refers to the process of driving a redox reaction in the reverse by passing an electric current through a reaction mixture.

Element Spacing refers to the distance between neighboring template elements measured e.g., in terms of the number of elements per unit area, center-to-center distance between elements or, in the case of pore-like elements, wall thickness.

Elongated Structures refers to geometrical shapes such as tubes, pillars, free-standing pillars, cylinders, needle- or whisker-like elongated crystals, protruding from a surface, as well as openings such as pores, and channels, e.g., generally hollow and substantially straight vertical openings, formed into or through a layer of material.

Hole-Acceptor. Electron-Acceptor: Hole-acceptor and electron-acceptor are relative terms for describing charge-transfer between two materials. E.g., for two semiconductor materials wherein a first material has a valence band edge or highest occupied molecular orbital (HOMO) that is higher than the corresponding valence band edge or HOMO for a second material, and wherein the first material has a conduction band edge or lowest unoccupied molecular orbital (LUMO) that is higher than the corresponding conduction band edge or LUMO for the second material, the first material is a hole-acceptor with respect to the second material and the second material is an electron-acceptor with respect to the first material. A particular band edge or molecular orbital is said to be "higher" when it is closer the vacuum level.

Hybrid Organic-Inorganic, with respect to photovoltaic devices and solar cells, refers to a device that uses both organic and inorganic materials either within a layer, in different layers or some combination of both.

Includes including e.g., "such as", "for example". etc., "and the like" may, can, could and other similar qualifiers used in conjunction with an item or list of items in a particular category means that the category contains the item or items listed but is not limited to those items.

Inorganic Materials: Materials which do not contain carbon as a principal element. Examples include metal-oxides and mixed metal oxides. These include both conductive materials (e.g. oxides such as titania, ITO, $SnO_x$, F-doped $SnO_x$, Al-doped $ZnO_x$, $ZnO_x$, etc.) and non-conductive materials such as $AlO_x$, $SiO_x$, etc.

Layer refers to a feature characterized by a substantially greater length and/or width compared to its thickness. A layer may be composed of multiple elements in a substantially two-dimensional array or two or more sub-layers stacked on top of one another or some combination of both.

Nanostructured: generally refers to the property of having features with a characteristic dimension on the order of several nanometers ($10^{-9}$ m) up to ten's of nm across.

Organic Materials: Compounds, which principally consist of carbon and hydrogen, with or without oxygen, nitrogen or other elements, except those in which carbon does not play a critical role (e.g., carbonate salts). Examples of organic materials include:

(a) Organic Dyes and pigments such as perylenes, phthalocyanines, merocyanines, terylenes and squaraines and their derivatives.
(b) Polymers: Materials consisting of large macromolecules composed of more than one repeating units. Polymers, composed of 2-8 repeating units are often referred to as oligomers. Examples of such repeating units include, e.g., dyes or pigments.
(c) Small Molecules, including pthalocyanines (e.g., CuPc), pentacene, $C_{60}$ or other fullerenes, as well as their respective precursors and derivatives.

Organic Solar Cell: A type of solar cell wherein an active photoelectric layer is fabricated, either partly or entirely, using organic materials, e.g., polymers, oligomers, molecules, dyes, pigments (including mixtures).

Photovoltaic Device: A device that absorbs radiation and coverts energy from the radiation into electrical energy. Solar cells are examples of photovoltaic devices.

Radiation: Energy which may be selectively applied including electromagnetic energy having a wavelength between about $10^{-14}$ and about $10^4$ meters including, for example, gamma radiation, x-ray radiation, ultraviolet radiation, visible light, infrared radiation, microwave radiation and radio waves.

Semiconductor: As used herein, semiconductor generally refers to a material characterized by an electronic band gap typically between about 0.5 eV and about 3.5 eV.

Solar Cell: A photovoltaic device that interacts with radiation (often in the form of sunlight) impinging on the device to produce electric power/voltage/current.

Template Element refers to a topological feature formed in a layer of template material.

Template Pore refers to a pore formed in a layer of template material.

Tubule refers to a hollow tube-like structure. A tubule can be formed, e.g., within a template element, such as a pore or channel, in which case the tubule can have a symmetry axis aligned substantially along the symmetry axis of the template element.

Tubule Pore refers to a central hollow space within a tubule that is substantially aligned along the symmetry axis of the tubule.

II. General Overview

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

In embodiments of the present invention, a photovoltaic device is built from an inorganic insulating nanostructured template. A first charge-transfer material coats the walls of the template elements leaving behind additional space. An optional conductive coating may be applied to the insulating nanostructured template before it is coated with the first charge-transfer material. A second (complementary) charge-transfer materials fill the additional space such that the first and second charge-transfer materials volumetrically interdigitate. At least one of the charge-transfers materials absorbs light or other radiation. In particular embodiments, the first and second charge-transfer materials are n-type and p-type semiconducting materials.

III. Photovoltaic Device

Figure 1B:
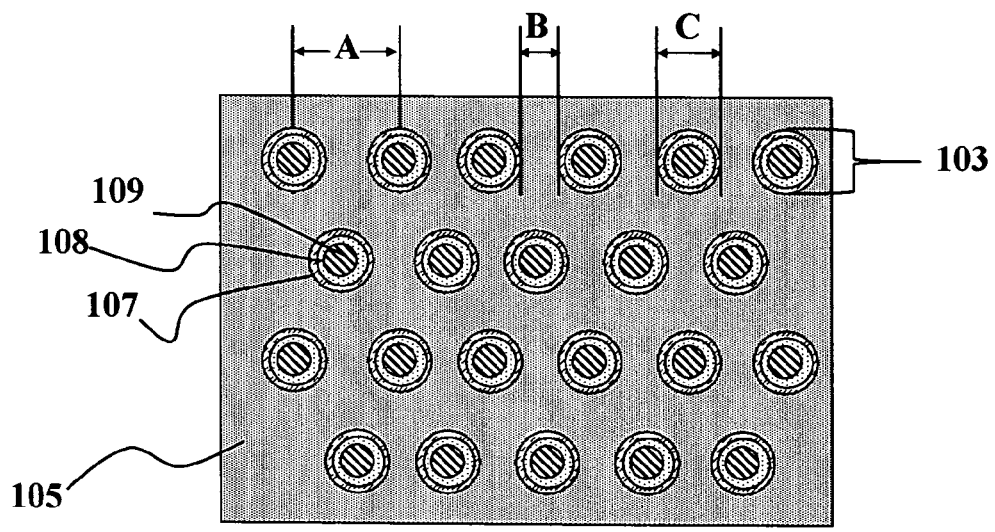
FIG. 1B is a horizontal cross-sectional schematic of the device of FIG. 1A taken along line B-B.

FIGS. 1A-1B depicts a portion of a photovoltaic device 100 according to an embodiment of the present invention. The device 100 generally includes an active layer 101 disposed between two electrodes e.g., a base electrode 110 and a transparent conducting electrode (TCE) 106 (or vice versa). An optional interface layer 104 may be disposed between the active layer 101 and the TCE 106. In addition, a semiconducting or conducting underlayer 111 may optionally be disposed between the active layer 101 and the base electrode 110. By way of example, and without loss of generality, the underlayer 111 may be a metal foil such as stainless steel, aluminum or titanium that may serve as an etch-stop or anodization stop layer. Alternatively, the underlayer 111 may be a layer of titanium oxide or zinc oxide or other metal oxide.

The TCE 106 and base electrode 110 may be conductive electrodes or they could include non-conductive materials that provide support, e.g., for conductive layers that serve as the actual electrodes. The base electrode 110 may be in the form of a commercially available sheet material such as such as C-, Au-, Ag-, Al-, or Cu-coated Steel or Al foil, or metal/alloy-coated plastic foils, including metal or metallized plastic substrates/foils that may be optionally planarized to reduce surface roughness. The base electrode may be pre-patterned (or patterned at a suitable stage during device fabrication) to facilitate parallel and/or series wiring of individual devices as commonly used in the fabrication of PV cell modules. In this context, pre-patterning can result in individual electrically insulated base electrode segments.

The base electrode 110 may alternatively be made from a transparent conducting material, e.g., indium tin oxide and the like disposed, e.g., on a glass or plastic substrate. The TCE 106 may be a layer of transparent conducting oxide (TCO) such as indium tin oxide (ITO) or fluorinated tin oxide ($F:SnO_2$). The TCE 106 may optionally include (either with or without a TCO) some combination of a transparent conducting polymer, a thin metal layer or an array of spaced apart wires, e.g., in the form of a mesh, grid or parallel wires. The optional interface layer 104 may be a short-proofing barrier layer or an organic material such as a conducting polymer. Examples of suitable organic materials include PEDOT (Baytron), or polyaniline doped with a dopant such as polystyrene sulfonic acid (PSS). In a particular embodiment, the interface layer 104 is poly-3,4-ethylenedioxythiophene-polystyrenesulfonic acid (PEDOT-PSS). In some embodiments, both the TCE 106 and base electrode 110 may be transparent. It is also possible to switch the locations of the TCE 106 and base electrode 110.

The active layer 101 includes a nanostructured insulating template 105, an optional conductive layer 107, and first and second charge-transfer materials 108, 109. It is often desirable that the template 105 be made from a material that is transparent in the visible and near IR light ranges. In a preferred embodiment, the porous template is made of an insulating material such as alumina (aluminum oxide) or other insulating materials. The template 105 may be formed by oxidizing a layer of metal 112 (e.g., aluminum) disposed on a surface of the base electrode 110. For purposes of illustration, a portion of the metal layer 112 is shown between the template 105 and the base electrode 110. It is also possible, and often desirable, to oxidize and structure the entire metal layer 112 (e.g., by anodization) so that the porous template 105 extends all the way to the base electrode 110. Alternatively, a metal layer (e.g., aluminum) may be partially anodized so that the base electrode 110 and template 105 are both formed from the same metal layer.

Preferably, the template 105 contains template elements 103, which may be distributed in a substantially uniform fashion, although exact uniform spacing, shape or size are not strictly required. The template elements 103 can be elongated structures, including, but not limited to, tubes, channels, pores, pillars, and the like, that may be substantially cylindrical in shape. Alternatively, the template elements 103 can have a cone-like shape, e.g., truncated cones tapering with the wider end furthest from to the layer of metal 112, i.e., towards the top of the drawing in FIG. 1A. The cone-like shape may also be reversed, i.e., with the wider openings being at the bottom and the narrower openings at the top. In some embodiments, the template elements 103 are in the form of nanotubes, e.g., hollow tubes with spaces between the sidewalls of the tubes.

The template elements 103 can be characterized by an average element spacing A, an average wall thickness B, and an average diameter C. The average spacing A can be measured, e.g., from center-to-center, and can range from about 10 nm to about 500 nm. In the case of tube-shaped template pores 103 the tubes can protrude 50 nm to 2000 nm above the template 105. Such tubes can have diameters ranging from 1 nm to 500 nm, with tube walls up to 50 nm thick.

Since the template 105 principally provides structure, it is desirable to have as little template material as possible between neighboring template elements. For hollow template elements, the average wall thickness B can range from less than about 5 nm to about 50 nm. The average diameter C can be in the range of several tens of nanometers to several hundred nanometers. For example, it is possible to form pores or tubes as small as about 2 nm to as large as about 500 nm in diameter. The density of the template elements 103 can range from about $10^{12}$ elements per square meter to about $10^{16}$ elements per square meter. For template elements of a given diameter C and densities greater than about $1/C^2$ the elements tend to overlap and merge with one another, although some degree of overlapping/merging may be acceptable. Also, the diameter C may be larger than the wall thickness B between neighboring template elements 103.

The template 105 may be further characterized by a thickness D. The thickness D may be the thickness of the entire metal layer 112, if it is oxidized entirely, or the thickness of the portion that is oxidized. Preferably, the template 105 is relatively thin. For example, the thickness D may be from about 50 nm to about 2000 nm (2 microns) thick.

To enhance the flow of electrons from the active layer 101, the insulating template 105 may optionally be coated with a conductive material 107, such that the conductive material 107 is disposed between the insulating template 105 and the first charge-transfer material 108. The conductive material 107 may be deposited over the template elements 103 in a substantially conformal fashion so as to allow a continuous connection between the elements 103 and the underlying bottom electrode 110. In particular, where the template 105 is made of an insulating material such as alumina (and sometimes when it is not), it may be necessary to remove a barrier layer from the bottoms of the template elements 103 so that the first charge-transfer material 107 can make electrical contact with the underlayer 111 and/or metal layer 112 and/or base electrode 110.

The conductive material 107 may be an inorganic material such as indium tin oxide, indium oxide, tin oxide, fluorinated tin oxide, Preferably, the conductive material 107 is a thin layer (e.g., about 1 nm to about 100 nm) of an electrically conductive material. More preferably, the conductive material 107 may be a conductive oxide such as tin oxide (SnOx), indium oxide (InOx), fluorinated tin oxide (F:SnOx), indium tin oxide (ITO), tungsten oxide, titania (titanium oxide, $TiO_2$), zinc oxide (ZnO) (with or without Al doping), zirconium oxide, lanthanum oxide, niobium oxide, tungsten oxide, strontium oxide, calcium/titanium oxide, vanadium oxide, zirconium oxide, molybdenum oxide, as well as blends or alloys of two or more such materials. Alternatively, the conductive material 107 may be a layer of a metal, such as titanium. In addition, the conductive material 107 may be a thin layer of an organic material such as PEDOT:PSS, doped conjugated organic materials, doped fullerenes, e.g., doped $C_{60}$, and the like.

The first charge-transfer material 108 coats the template elements 103 in a way that leaves behind additional space not occupied by the first charge-transfer material 108. The second charge-transfer material 109 fills the additional space and does not protrude substantially out of the template 105. For example, where the elements 103 are, e.g., in the form of an array of nanotubes, the second charge-transfer material 109 may fill the hollow spaces in the centers of the nanotubes and empty space between the tubes such that the first and second charge-transfer materials are volumetrically interdigitated. It is often desirable that the first and second charge-transfer materials do not extend significantly beyond the surface of the nanostructured template 105. Thus, the first and second charge transfer materials 108, 109 may fill space between and/or within the template elements 103 up to a level that is substantially even with an upper surface of the template 105. Preferably, at least a part of the first charge-transfer material 108 is connected to the bottom of the elements 103 to provide electrical contact, i.e. a charge carrier path, between the first charge-transfer material 108 and the base electrode 110 or optional underlayer 111.

Figure 1C:
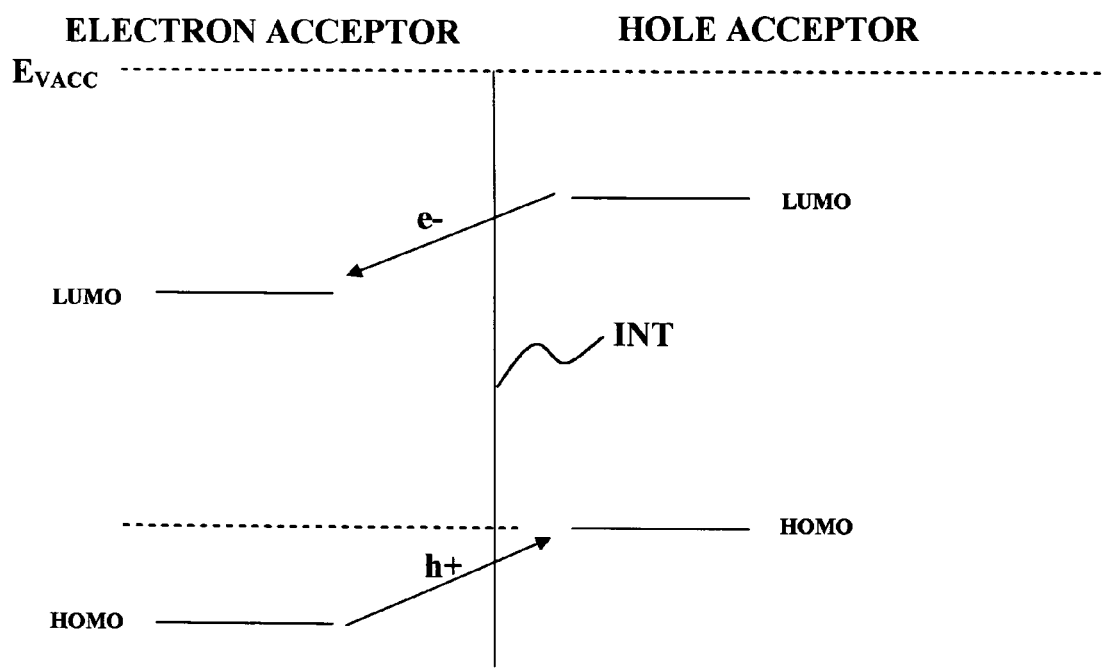
FIG. 1C is an energy level schematic diagram illustrating energy levels for two complementary charge-transfer materials.

The first and second charge-transfer materials 108, 109 have complementary charge-transfer properties with respect to each other. In general one of the first and second charge-transfer materials 108, 109 may be regarded as an electron acceptor while the other may be regarded as a hole acceptor. Charge-transfer materials may be characterized by a lowest unoccupied molecular orbital (LUMO) or conduction band and a highest occupied molecular orbital (HOMO) or valence band as indicated schematically in FIG. 1C. Where two charge transfer materials with different energy levels meet at an interface INT electrons e− tend to move across the interface INT from the higher LUMO or conduction band to the lower LUMO or conduction band. Similarly, holes h+ tend to move across the interface INT from the lower HOMO or valence band to the higher HOMO (or valence band). Note that it is possible for a given material to be a hole acceptor with respect to one material and an electron acceptor with respect to another material.

In embodiments of the present invention, it is desirable that a lowest unoccupied molecular orbital (LUMO) or conduction band of the first charge-transfer material 108 differs from a LUMO or conduction band of the second charge-transfer material 109 by more than about 0.2 eV. Furthermore, it is desirable that at least one and possibly both charge-transfer materials absorb light or other radiation from some portion of the electromagnetic spectrum. More specifically, it is also desirable for at least one of the charge transfer materials 108, 109 to have an absorbance of greater than about $10^3$/cm at the peak of absorption, more preferably, greater than about $10^4$/cm at the peak of absorption.

In the example shown in FIG. 1A, the first charge-transfer material 108 may coat the walls and bottoms of the template elements 103 and the second charge-transfer material 109 coats the first charge-transfer material to form tubules with the additional space being in the form of tubule pores. The second charge-transfer material 109 may fill the tubule pores. Each tubule may be characterized by an outside diameter roughly equal to the inside diameter of the corresponding template elements 103. Each tubule pore may be characterized by a tubule pore diameter d ranging from about 1 nm to about 500 nm. In general the tubule pore diameter d is less than the template pore diameter C. By way of example, the tubules may have a tubule wall thickness of up to about 100 nm and a total tubule height of up to up to about 2 microns. In an alternative embodiment, the first and second charge-transfer materials 108, 109 may be blended together in a blend that fills template elements 103.

The tubule pore diameter d may represent an inner diameter for a tubule of the first charge-transfer material 108. The outer diameter for the tubule is essentially the template structure diameter C, less the thickness of the optional conductive layer 107, if it is present. The tubule may have a wall thickness given by the half the difference between the inner and outer tubule diameters, i.e., (C−d)/2. The tubule wall thickness may range from about 0.5 nm (5 Angstroms) to about 20 nm, preferably from about 0.7 nm to about 15 nm, more preferably about 10 nm, and most preferably about 5 nm. For example, the tubule diameter C may be about 40 nm, the tubule pore diameter d may be about 30 nm, and the tubule wall thickness would be about 5 nm on each side of the tubule pore, i.e., 5+30+5=40 nm across the cross-sectional diameter of the tubule.

The first charge-transfer material 108 may be an inorganic semiconducting material. Examples of suitable inorganic materials that may be used as the first charge-transfer material 108 include, e.g., metal oxides such as titania ($TiO_2$), zinc oxide (ZnO), copper oxide (CuO or $Cu_2O$ or $Cu_xO_y$), zirconium oxide, lanthanum oxide, niobium oxide, tin oxide, indium oxide, indium tin oxide (ITO), vanadium oxide, molybdenum oxide, tungsten oxide, strontium oxide, calcium/titanium oxide and other oxides, sodium titanate, potassium niobate, cadmium selenide (CdSe), cadmium suflide (CdS), copper sulfide (e.g., $Cu_2S$), cadmium telluride (CdTe), cadmium-tellurium selenide (CdTeSe), copper-indium selenide ($CuInSe_2$), cadmium oxide ($CdO_x$) i.e. generally semiconductive materials, as well as blends or alloys of two or more such materials.

Alternatively, the first charge-transfer material 108 may be an organic p- or n-type material e.g. fullerenes or modified/functionalized fullerenes (e.g. PCBM). The first charge-transfer material 108 may or may not absorb a substantial fraction of the incident light.

The second charge-transfer material 109 may be an organic material. Preferably, the second charge-transfer material 109 is an organic material that absorbs light in the bulk of the material. Examples of suitable organic materials include conjugated polymers such as poly(phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly(para-phenylene vinylene), (PPV)), PPV copolymers, poly(thiophene) and derivatives thereof (e.g., poly(3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom), poly(thienylenevinylene) and derivatives thereof, and poly(isothianaphthene) and derivatives thereof. Other suitable polymers include organometallic polymers, polymers containing perylene units, poly (squaraines) and their derivatives, and discotic liquid crystals. Other suitable organic materials include organic pigments or dyes, azo-dyes having azo chromofores (—N═N—) linking aromatic groups, phthalocyanines including metal-free phthalocyanine; (HPc), perylenes, perylene derivatives, Copper pthalocyanines (CuPc), Zinc Pthalocyanines (ZnPc), naphthalocyanines, squaraines, merocyanines and their respective derivatives, poly(silanes), poly(germinates), 2,9-Di(pent-3-yl)-anthra[2,1,9-def:6,5,10-d'e'f]diisoquinoline-1,3,8,10-tetrone, and 2,9-Bis-(1-hexyl-hept-1-yl)-anthra[2,1,9-def:6,5,10-d'e'f]diisoquinoline-1,3,8,10-tetrone and pentacene, pentacene derivatives and/or pentacene precursors.

The first and/or second charge-transfer materials 108, 109 may also include polyfluorenes and polyfluorene-based copolymers and blends, e.g. co-polymerized and/or blended with charge transporting (e.g. tri-phenyl-amines and derivatives) and/or light-absorbing compounds (e.g. fused thiophene rings and derivatives, generally hetero-atom ring compounds with or without substituents), pigments, dyes, or fullerenes. In a particular embodiment, the second charge-transfer material 109 can include fullerenes.

In one particular embodiment, among others, the first charge-transfer material 108 is a thin layer (e.g., about 1 nm to about 100 nm, more preferably about 10 to about 50 nm) of amorphous silicon (a-Si), which is a well-known thin-film PV material. Several deposition technologies, e.g. sputtering, ALD, CVD, PECVD, MOCVD etc., have been developed and several of these are widely in use to deposit a-Si films. Several of these methods have the potential to deposit doped or undoped a-Si films not just on surfaces but down high aspect ratio holes (e.g. via-holes). Unfortunately, amorphous Si has a low absorption coefficient. Thus, when making prior art a-Si PV cells, thick films of a-Si need to be deposited which is time consuming and costly. Prior art amorphous Si PV cells typically employ film thicknesses in excess of 1 micron and often significantly more. When a-Si is the main active layer in a prior art PV cell, light is absorbed in the a-Si layer, which has been shown to degrade, in particular upon exposure to UV light. Organic and organic-inorganic hybrid solar cells typically rely on the absorption of light in an organic, creating an exciton, followed by the splitting of the exciton into a positive and negative charge carrier at an exciton-splitting interface. To make such prior art PV cells efficient, a high surface area of the exciton-splitting interface and preferably a short path for negative and/or positive charge carrier to their respective charge-collecting electrode are desirable.

The features briefly described above suggest why a-Si (p- or n-type but in particular n-type)/organic hybrid solar cells have not been made in the prior art. For example, in Graetzel-type cells a film of titania particles may be coated with a-Si. It would be difficult to completely and efficiently deposit a-Si in the narrow channels after sintering a film of randomly arranged titania particles. Further, a flat a-Si/organic cell would have a limited exciton-splitting interface. It may be beneficial for a PV cell with e.g. homogeneous organic layers or all-organic blends to be put on an a-Si layer instead of straight onto a charge-carrier-collecting electrode. However, the organic layer or blend is likely to dominate performance. To make blend cells (e.g., with organics and nano-nano-rods) with a-Si one would have to make coated a-Si nanorods. However, one can make crystalline semiconductor particles/rods of crystalline Si (and CdSe, CdTe, Si, GaAs, etc.), which would be better than the amorphous versions. These cells however have their own well-known limitations (such as morphological irregularity, a high potential for nanorod clumping, etc.).

In order to make efficient inorganic/organic hybrid (and other) solar cells, it is normally important to carefully match energy levels (HOMO/LUMO, valence and conduction bands, inter-band charge transport energy levels) to each other to optimize performance. This is often very difficult. However, with a thin coating of a-Si as the first charge-transfer material 108, it is possible to match the appropriate energy level of the first charge transfer material 108 to the energy level of the second charge-transfer material 109 quite well, particularly where the second charge-transfer material is an organic material. Thus, the efficiency of the device 100 in converting light energy into electrical energy may be enhanced. Alternatively, the second charge-transfer material 109 could also be an inorganic material.

The a-Si coating could be made thicker in a 'coarser' template 105 to provide some (perhaps a more significant) light-absorption function. In a more preferred embodiment, the first charge-transfer material is n-type doped a-Si and the second charge-transfer material 109 is a p-type organic material. A thin coating of a-Si can be largely transparent. Furthermore an a-Si coating deposited on the walls of the template elements 103 by standard deposition methods, e.g., sputtering, CVD, PECVD and the like. The cost of deposition with these techniques is highly correlated with deposition time. Fortunately, thin coatings (e.g., about 1-100 nm) can be deposited with these techniques in relatively short deposition times.

Where the first charge-transfer material 108 is made of a-Si, and sometimes when it is not, the first charge-transfer material 108 may be thicker at an upper portion of the nanostructured template 105, e.g., closer to the TCE 106 than at a lower portion of the template 105, e.g., closer to the base electrode 110. Preferably, the thickness of the first charge-transfer material 108 is substantially uniform throughout the coated template 105 to within about 100% (e.g., 20 mm thick at the top and 10 nm thick at the bottom). More preferably, the thickness of the first charge-transfer material is uniform to within about 50%. In addition, if sufficiently highly doped a-Si is used as the first charge-transfer material 108, insulating alumina may be used as the template 105 (with a bottom barrier layer removed and/or reduced to render it conductive) because the doped a-Si layer would also provide the conductive path. Thus, the conductive layer 107 may not be necessary.

Where the first charge-transfer material 108 is a-Si, the second charge-transfer material 109 may be an organic material having a band gap that is less than about 2 eV or less than about 1.7 eV. For n-type a-Si as the first charge-transfer material 107, the dominant negative charge carrier energy levels of the second charge-transfer material 109 can lie within 1 eV but better within 0.5 eV of the a-Si conduction band/. Preferably the dominant negative charge carrier energy level of the second charge-transfer material 109 is less than 1 eV and preferably 0.5 eV above the a-Si conduction band/states and a HOMO level (or equivalent p-type charge carrier transporting level) of the second charge-transfer material 109 is above that of the a-Si valence band. The choice of materials may affect whether the resulting device 100 has the desired energy levels. By way of example, where the first charge-transfer material 108 is a-Si, thiophene-, fluorine- or aryl-vinyl-based polymers, copolymers or blends may be used as the second charge-transfer material 109. In order to further optimize band-gaps and energy levels and hence cell performance, the a-Si layer may be suitably doped by e.g. carbon or germanium. Also, the a-Si layer employed in certain embodiments of the present invention, can and would typically be hydrogenated. Also, the a-Si layer (with the employed level of doping, hydrogenation, etc.) may be optionally treated (chemically, wet-chemically—e.g. via an HF etch) prior to deposition of the second charge transfer material 109 (or an optional interfacial layer 113—see below) in order to remove potential a-Si surface oxide layers. Furthermore, the surface of the a-Si may also be passivated to protect it from a surface oxide layer growth and/or to enhance exciton splitting and/or charge transfer and/or reduce undesired exciton recombination.

Figure 1D:
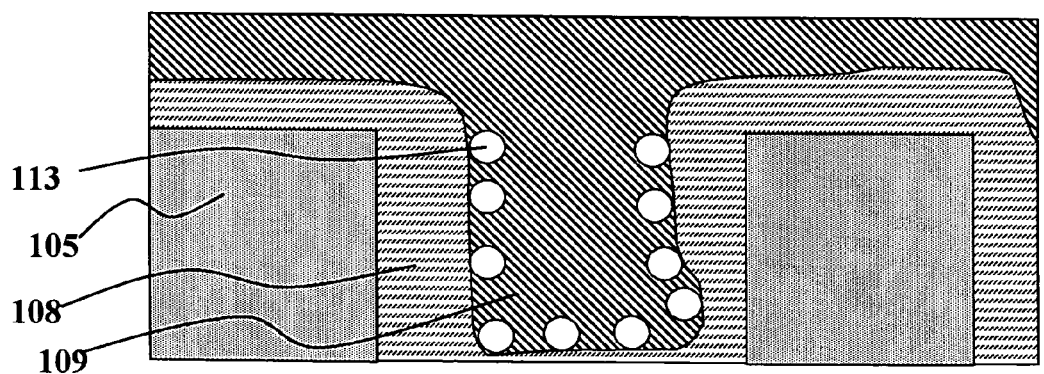
FIG. 1D is a vertical cross-sectional schematic diagram of a close-up view of a part of the device of FIG. 1A.

In another embodiment, an optional interfacial layer 113 may be disposed between the first and second charge-transfer materials 108, 109 as shown in FIG. 1D. The interfacial layer 113 may enhance the performance of the device 100. For example, the interfacial layer 113 may be configured to enhance the efficiency of the device 100 in the form of one or more of (a) differential charge-transfer, i.e., charge-transfer between the two materials that exhibits different rates for forward versus backward transport; (b) differential light absorption to extend a range of wavelengths that the active layer can absorb; or (c) enhanced light absorption and/or charge injection. Examples of such interfacial layers are described in detail in commonly assigned U.S. patent application Ser. No. 10/419,708, the entire disclosures of which are incorporated herein by reference.

By way of example, the interfacial layer 113 may contain organic materials attached onto (not below) the first charge-transfer material 108. Examples of such organic materials include fullerenes (e.g., $C_{60}$, $C_{70}$ and the like, either chemically functionalized or non-functionalized), carbon nanotubes, dyes, ruthenium dyes, pigments, and organic monomers, oligomers, and polymers, any of which may be deposited singly or in combination onto the first charge-transfer material 107. The second charge-transfer material 108 can be a monolayer or multi-layer interfacial layers may be used as well. The interfacial layer 113 may be in the form of individual molecules, monomers or oligomers or a continuous or substantially continuous layer between the first and second charge-transfer materials 108, 109.

The choice of material for the interfacial layer 113 may depend on the materials used for the first charge-transfer material 108 and the second charge-transfer material 109. By way of example, and without loss of generality, where the first charge-transfer material 108 is a-Si, well-known 'electron-channel/absorbing' dyes such as rubidium dyes can be included in the interfacial layer 113 between the first and second charge-transfer materials 108, 109. Such dyes may have a LUMO level very close to that of a-Si.

Doped (or undoped) fullerenes such as $C_{60}$ can also be functionalized, e.g., so that they can be attached covalently to the first charge-transfer material 108. The carbon layers in fullerenes such as $C_{60}$ may be curved due to inclusion of five-membered rings considerable strain energy in the fullerenes is reduced when the carbon atoms of a C=C double bond are replaced by two sp3-hybridized carbon atoms. This can be exploited for functionalization of the fullerenes by addition reactions.

The interfacial layer 113 may also include chemicals that can covalently attach to the first charge-transfer material 108, e.g., a silane, and thus change the surface energy and/or bonding trap-states and/or attach to dangling-bonds at an exposed surface of the first charge-transfer material 108 and/or introduce a dipole layer that may increase the efficiency for charge extraction and/or reduce detrimental charge recombination. Examples are functionalization with benzoic, various carboxylic acid-group-containing compounds and other acids, tert-butyl-pyridine, surfactants, dye molecules, silanes and silicon compounds or their functionalized derivatives that are often used as adhesion-promoters. The surface of the first charge-transfer material 108 may also be functionalized with silylating agents for modulation of surface properties, and/or for introduction of functional groups (amine group, aliphatic group, hydroxyl, carboxylic etc.) for further surface derivitization. In particular, interfacial layer 113 may be a layer of $C_{60}$ or other fullerenes functionalized with a carboxylic acid moiety combined with hydroxylating a metal oxide first charge-transfer material 108 to produce preferential charge flow into or out of the first charge-transfer material 108.

The conductive layer 107 and/or the first and/or second charge-transfer materials 108, 109 may generally include other organic materials, e.g., a conjugated polymer coating the first charge-transfer material 108. For example, the nanostructured template 105 could be sequentially coated with different layers of conjugated polymer or other organic materials, which are then melt-infiltrated to create, via surface energy effects, the desired layered or blended structure of the first and second charge-transfer materials 108, 109.

Furthermore, the first charge-transfer material 108 and/or interfacial layer 113 may be created by self-assembly or electro-static self-assembly of materials such as PEDOT:PSS or other materials deposited from ionic/charged polymer solutions (e.g. tetra-hydro-thiophene precursor poly-phe-nylene-vinylene and derivatives). In addition, although the first and second charge-transfer materials 108, 109 are described as being respectively an inorganic material and an organic material, it is possible to make the active layer 101 with the first charge-transfer material 108 organic and the second charge-transfer material 109 inorganic or with both charge-transfer materials 108, 109 being organic.

By changing the process parameters of the Aluminum anodization so that pore widening (via etching) occurs in parallel with (or after) the deepening of the pores, cone-like pores can be created that can have certain charge transport advantages. Such cone-like pores are a variant of the pores shown in FIGS. 5A-1B above. Note that pore-widening or 'cone-shaping' could also be done by other methods such as plasma-etching, reactive-ion-etching (RIE), anisotropic RIE. 'Cone-shaping' the template elements 103 may facilitate the coating of the nanostructured template 105 with e.g. the first charge-transfer material 108 (and/or interfacial layer 113 and/or optional conductive layer 107 as described above), particularly when the deposition method for the first charge-transfer material 108 and/or interfacial layer 113 is e.g. sputtering, evaporation or similar deposition process. Care should be taken to avoid clogging the pores at the top before the rest is filled or coated. Cone-shaping may prevent the 'clogging' of both template pores and tubule pores at various fill-stages (e.g., for filling the template elements 103 with the first charge-transfer material 108 and/or the interfacial layer 113 and/or filling the tubule pores 102 with the second charge-transfer material 109).

In a preferred embodiment the conductive material 107 may be a layer of a conductive transparent oxide (such as ITO or $F:SnO_2$) deposited via ALD or PECVD or CVD or sputtering on top of a nanostructured template 105 made of anodized alumina. The ITO may then be covered with a layer of n-type semiconducting titania as the first charge-transfer material 108, deposited via ALD or CVD or sputtering, which may then be solution-coated with an (optional) thin layer of functionalized $C_{60}$ ($C_{60}$—COOH, PCBM, or similar materials) as the interfacial layer 113 between the first and second charge-transfer materials. The second charge-transfer material 109 may be a layer of organic polymer deposited by solvent vapor deposition or a solution based deposition technique. Alternatively, a small organic molecule such as pentacene could be vapor deposited or evaporated into the nanostructured template 105 using a standard organic evaporation method, or a soluble Pentacene precursor could be solution-deposited into the template, after which the Pentacene precursor could be converted to Pentacene through annealing.

In a first alternative embodiment, the first charge transfer material 108 may be an n-type semiconductor coating material (e.g. titania or ZnO or other metal oxide) that may be coated onto a template 105 made of alumina that has been anodized down to an underlying titania or other n-type underlayer 112. The second charge-transfer material 109 may be a layer of organic polymer deposited by solvent vapor deposition or a solution based deposition technique. Alternatively, a small molecule such as pentacene could be evaporated into the nanostructured template 105 using a standard organic evaporation method, or a soluble Pentacene precursor could be solution-deposited into the template, after which the Pentacene precursor could be converted to Pentacene through annealing.

In a second alternative embodiment, the conductive material 107, may be an n-type semiconductor coating material (e.g. titania or ZnO or other metal oxide) that may be coated onto a template 105 made of alumina that has been anodized down to an underlying titania or other n-type underlayer 112. The first charge-transfer material 108 may be a layer of n-type a-Si deposited by chemical vapor deposition, metal-organic chemical vapor deposition, evaporation, sputtering, atomic layer deposition, etc. conductive material 107. The second charge transfer material 109 may be an organic or inorganic p-type material, e.g., such as those described above.

In a third alternative embodiment, the conductive material 107 (e.g. indium tin oxide, tin oxide, fluorinated tin oxide, Al-doped ZnO, or other conductive material) may be coated onto a template 105 of alumina and into elements 103 in the form of alumina tubes that have been created/anodized down to an underlying titania or other n-type underlayer 112. The tube height may be as great as 2000 nm. The tube width may be as wide as 500 nm, more typically about 300-500 nm, or possibly as small as 50 nm or less. The conductive material 107 may be deposited for example by atomic layer deposition (ALD). The first charge transfer material 108 may be a 50 nm layer of n-type CdS deposited at the base and along the sidewalls of the tubes, e.g., by electrodeposition or chemical bath deposition. A second charge-transfer material 109 such as p-type CdTe, CdSe or $Cu_2S$ may then be deposited into the tubes for example by electrochemical techniques.

In a fourth alternative embodiment, if the template 105 and base electrode 110 may be made from the same layer of metal, e.g., by partial anodization as described above, it may be desirable to dispense with the underlayer 111 and instead coat the bottoms of the template elements 103 with a conductive or semiconductive material similar to that of the underlayer 111 after removing a barrier layer, if any. The conductive or semiconductive material at the bottoms the template elements 103 may not be necessary if the first charger transfer material 108, conductive layer 107 (if any) or an interfacial layer 113 (if any) would otherwise make sufficient electrical contact with the bottom electrode 110.

In other alternative embodiments the first and second charge-transfer materials 108, 109 may be entirely inorganic, e.g. a inorganic multilayer that fills template structures 103 or the space unoccupied by the conductive material 107 if it is present.

IV. Photovoltaic Device Fabrication

Apparatus of the type shown in FIGS. 1A-1B can be fabricated according to embodiments of an inventive method. FIG. 2 depicts a flow diagram illustrating an example of such a method 200. Examples of how the method might be carried out are depicted in the sequences of cross-sectional diagrams depicted in FIGS. 3A-3M. The method 200 begins at 202 by forming a nanostructured template, e.g., by anodizing a layer of metal, e.g., a metal substrate or a substrate with at least one metal coating, having an array of template elements distributed in a substantially uniform fashion. At 204 the template elements may optionally be coated with a conductive material. At 206, a first charge transfer coats the template elements leaving behind additional space. At 208, a second (complementary) charge-transfer materials fill additional space not occupied by the first charge-transfer material. Electrodes may optionally be added at 210 and the resulting device may optionally be encapsulated at 212.

A. Forming a Nanostructured Template

Figure 3A:
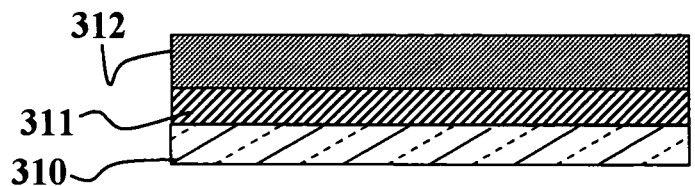
FIGS. 3A-3F depict a series of vertical cross-sectional schematic diagrams illustrating one possible sequence of steps for carrying out the method of FIG. 2.
Figure 3B:
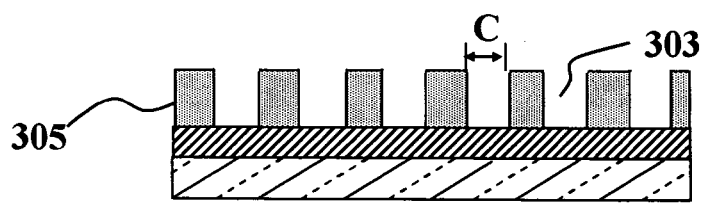
Figure 4A:
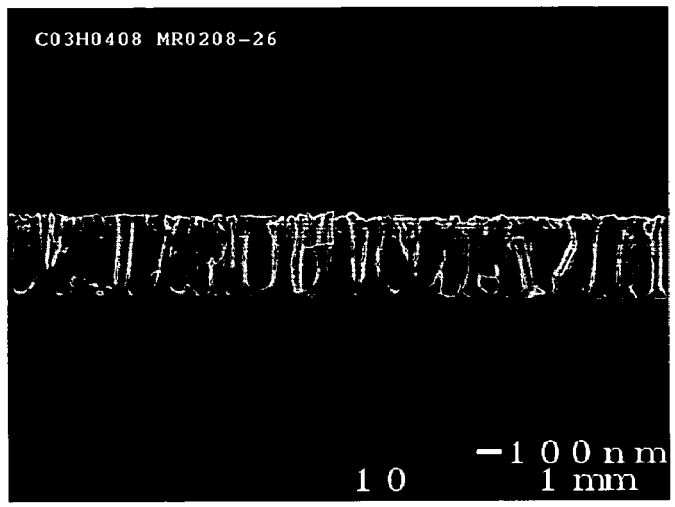
FIG. 4A depicts a scanning electron microscope (SEM) image of a vertical cross-section of a nanostructured alumina template.
Figure 4B:
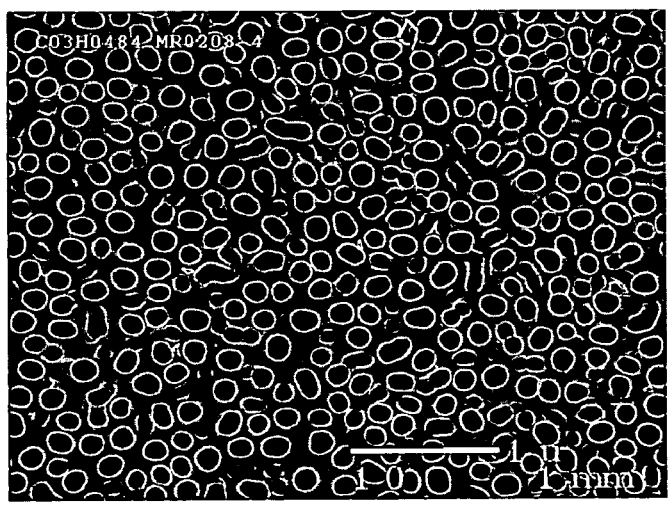
FIG. 4B depicts a scanning electron microscope (SEM) image of a horizontal cross-section of a nanostructured alumina template.

With respect to step 202 of FIG. 2, there are a number of different ways to form a porous template. In a preferred embodiment, as shown in FIGS. 3A-3B, a porous template can be anodized from a layer of metal (e.g., aluminum) 312 disposed on a substrate 310. By way of example, when a metal layer is treated anodically in an acid electrolyte, an oxide film 305 can be formed at the metal surface as shown in FIG. 3B. An array of template elements 303 can be formed in the oxide film 305, while the oxide film 305 is created. Where the oxide film 305 extends all the way through to the substrate 310, material at the bottom of the template elements 303 can be removed by chemical means or by incrementally stepping down the voltage. Where a portion of the metal layer 312 remains between the oxide film 305 and the substrate 310, the material at the bottom of the template elements 303 can be chemically removed or can be left in place (e.g., as an electrode). The anodizing voltage controls pore size and pore density, and the total amount of charge-transferred determines film thickness. By way of example, aluminum can be treated anodically in a phosphoric acid electrolyte. Examples of nanostructured alumina templates made in this way are depicted in the SEM images of FIG. 4B and FIG. 4C. The SEM images of FIGS. 4A and 4B also illustrate an example of template pores distributed in a substantially uniform fashion.

The preferred thickness range for the metal layer to be anodized is from about 100 nm to about 2 microns, preferably in the 200-nm to 600-nm range, and more preferably about 300 to 500 nm. Porous templates in these thickness ranges provide useful depths for proper optoelectronic function in the resulting PV device. To anodize the metal substrate (e.g. aluminum) to its porous metal oxide equivalent (e.g., alumina), the anodization voltage, current, acid concentration, anodization time, and temperature can be adjusted to improve pore formation in a metal film whose initial thickness ranges from (for example) 150 to 250 nm. In particular, based on the thickness of the metal substrate, the anodization voltage, current, acid type, acid concentration, electrolyte additives, anodization time, and temperature can be adjusted to provide for a porous template with specific target dimensions.

Structure sizes in such films typically range from 10 to 450 nm, though it is also possible to form template elements as small as 2 nm and as large as 500 nm. The typical density of template elements is about $10^{12}$ to about $10^{16}$ elements per square meter. A film thickness of 100 to 500 nanometers is generally achieved, though films can be formed whose thickness is as small as 10 nm and as great as 50-100 microns.

To form a nano structured alumina template, Al metal (e.g., 99.99% pure) may be coated onto a glass or metal foil substrate by use of evaporation, e-beam evaporation, sputtering, or the like. Alternatively, an Al foil may be commercially purchased from any of a variety of vendors. The film may be anodized by treatment at 1-250V for a specified time, e.g., on the order of several minutes, in 5-10% $H_3PO_4$ below 10° C. For example, in 75 min, an aluminum oxide film of roughly 30 microns thick can be generated. The potential voltage may range from about 1V to about 250V. The preceding protocol may result in porous alumina template elements in the form of pores or tubes in the diameter range of about 10-450 nm. Once the anodization is complete, the anodized material at the base of the pores may be perforated by stepping down the anodizing voltage, e.g., from 100V to 0.1 V is greater. Alternatively, the barrier layer at the base of the template tubes may be removed using chemical etching, for example using an acidic bath that promotes pore-widening. To further widen the pores or tubes, anodized specimens are then immersed in a 5% (vol) phosphoric acid solution at 30° C. for 5-60 min, both to enlarge the pore size and to remove the typical barrier layer found on most anodic alumina films. Typically pore widening and barrier layer removal are carried out simultaneously in the same process. Further, the anodized material at the base of the pores may be made conducting by a suitable reduction reaction.

It is also possible to make the porous template by anodizing a metal layer to form an oxide film on glass, ITO-coated glass, F:$SnO_2$ coated glass, ITO coated PET or other plastic, or other coated or non-coated metal foils as well as metallized plastics. More specifically, the substrate 310 may be a sheet of glass or plastic or metal or a continuous foil of metal or plastic with a base electrode. The base electrode (transparent or otherwise) may be the substrate 310. The substrate/base-electrode 310 may be covered with a metal (e.g., aluminum) layer composed of the to-be-anodized aluminum.

Nanostructured templates, may also be made by a reactive ion etching technique using an anodized porous template as an etch mask. Such techniques are described e.g., in U.S. patent application Ser. No. 10/719,042, filed Nov. 21, 2003, which is incorporated herein by reference. Nanostructured templates can also be made by surfactant temptation techniques such as those described in commonly assigned U.S. patent application Ser. Nos. 10/290,119, 10/303,665 and 10/319,406, which are incorporated herein by reference.

Referring to FIG. 3A an underlayer 311 may be disposed between the substrate/base electrode 310 and the subsequent layers, e.g., the metal layer 312 that is to be anodized, etc. The underlayer 311 may be a metal layer that can act as an 'anodization-stop layer' and/or may act as an etch-stop layer for the tube- or pore-widening and bottom barrier layer removal etch process. Alternatively, the underlayer 311 may be a semiconducting layer e.g., titania, disposed between the substrate 310 and the subsequent layers. Such an underlayer can reduce undesired contact between a material filling the template elements 303 and the substrate/base electrode 310. Alternatively, the intermediate layer 311 may prevent damage to the underlying substrate 310 (e.g. in case of the base electrode 310 being ITO). Very specifically, the substrate 310 could be made from a metal or alloy or stainless steel or metallized plastic foil substrate, followed by an intermediate layer, e.g., an etch-stop-layer and/or titania layer, followed by the metal layer 312 that gets anodized to create the nanostructured template 305. The intermediate layer 311 (e.g. semiconductor or metal) may be particularly useful if charge-transfer materials in the template elements 303 do not go all the way down to the bottom of template elements 303. If the template 305 and base electrode 310 may be made from the same layer of metal, e.g., by partial anodization as described above, it may be desirable to dispense with the underlayer 311 and instead coat the bottoms of the template elements 303 with a conductive or semiconductive material similar to that of the underlayer 311 after removing a barrier layer, if any.

B. Coating the Template Elements with the First Charge-Transfer Material and/or Optional Conductive Material With respect to 204 of FIG. 2, a variety of deposition techniques could be employed to coat the template elements 303 with the first charge-transfer material 308 and/or with the optional conductive layer 307 (and or the layer 311 at the bottom of 305 e.g., by electrodeposition, layer-by-layer deposition or other liquid phase or chemical bath deposition techniques). Such techniques include, but are not limited to, electrochemical and electroless (chemical bath) deposition, evaporation, sputtering, plating, ion-plating, molecular beam epitaxy, atomic layer deposition (ALD), plasma-enhanced ALD, electrochemical atomic layer epitaxy, sol-gel based deposition, spray pyrolysis, vapor-phase deposition, solvent vapor deposition, metal-organic vapor phase deposition, metal-organic-vapor-phase epitaxy, atomic layer deposition, chemical vapor deposition (CVD), pulsed CVD, plasma-enhanced CVD (PECVD), metal organic CVD (MOCVD), metal-organic-vapor-phase epitaxy, self-assembly, electrostatic self-assembly, melt-filling/coating, layer-by-layer (LBL) deposition, or liquid phase deposition among other techniques. In general, the first charge-transfer material 308 may be created via deposition or reaction or condensation from the liquid or gas phase or by physical deposition methods. Furthermore the first charge-transfer material 308 may be deposited by electro-deposition, electro-plating, ion-plating, and the like.

Where the insulating nanostructured template 305 is made by anodizing a layer of metal, the template 305 may be coated with the optional conductive layer 307 by reducing an upper portion of the template 305 to make it electrically conducting. For example, the upper portion of an anodized template may be reduced by exposing it to a suitable reducing agent to promote a chemical reaction that reduces oxides. Alternatively, the conductive layer 307 may be formed by depositing material over the nanostructured template 305. Furthermore, some combination of reducing the template 305 and depositing a coating may be used to form the conductive layer 307.

Figure 3C:
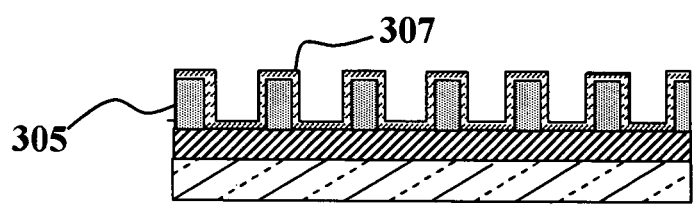
Figure 3D:
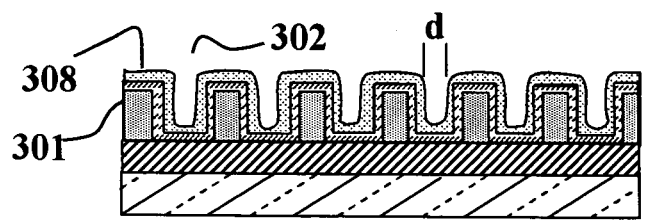

The first charge-transfer material 308 may coat the template elements 303 in a way that forms thin tubules 301 that coat the walls of the template elements 303 as shown in FIG. 3C. The tubules 301 have tubule pores 302 left behind by the tubule forming process. By way of example, and without loss of generality, a semiconducting or conducting metal oxide such as ITO can be coated on the walls of the template elements 303, e.g., by sputtering, CVD, atomic layer deposition, or other coating techniques.

If the first charge-transfer material 308 is a-Si, the exposed surface of the first charge-transfer material 308 may be subjected to an etch step to remove surface oxides, e.g. by commonly known techniques to remove surface oxide layers from a-Si. Such an etch step may be performed either after depositing the first charge-transfer material 308 or before deposition of a subsequent layer or both.

Although, the preceding example describes coating the template elements 303 with an inorganic material, the template elements 303 may alternatively be coated with an organic material such as those listed above with respect to the second charge-transfer material 109.

C. Filling Additional Space with $2^{nd}$ Charge-Transfer Materials

Figure 3E:
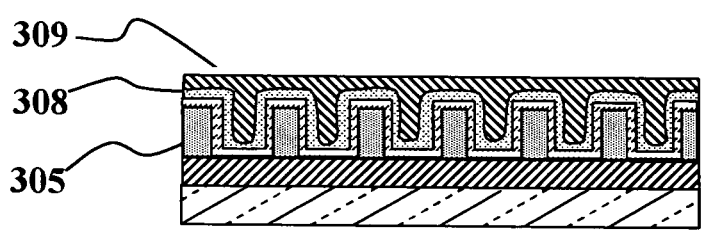

With respect to 206 of FIG. 2, there are several different ways to fill additional space not filled by the first pore-filling step in 204. For example, a second charge-transfer material 309 may fill parts of the template elements 303 not filled by the first charge-transfer material 308 and/or conductive material 307 as shown in FIG. 3E. Alternatively, the first and second charge-transfer materials 308, 309 may be blended together in a mixture and the mixture can fill elements 303. Such blend may be specifically designed and chosen and/or processed after filling such that a phase-separation occurs in order to promote enrichment of one phase (e.g. the first charge-transfer material 308) at the surface of the template 305 (or conductive material 307) and the other in the inner area/volume of the template 305, thus creating a partial or substantial bi-layer structure.

The second charge-transfer material 309 may be an organic material as described above. Such organic materials can be deposited by capillary action, melting, and/or through the assistance of surface energy or osmotic gradients or solvent vapor exposure. Organic polymers and other materials can be used, alone or in combination, at this step, such as those described above with respect to the second charge-transfer material 108. Organic charge-transfer materials can be applied to the template elements 303 from process solutions, e.g., by any suitable technique, e.g., web-coating, doctor blade coating, spray coating, spin coating, casting, dip-coating or a printing technique such as printing such as screen-printing, ink-jet printing, flexographic printing, gravure printing, micro-gravure printing, and the like. Heat may be applied to the nanostructured network layer and network-filling material during this step, e.g., to evaporate solvents and set the network-filling material and/or to assist material infiltration, e.g., through capillary action and/or assistance of surface energy or osmotic force.

In a preferred embodiment, the organic material may be exposed to a solvent vapor to facilitate infiltration into the template elements 303. Examples of such solvent vapor phase infiltration are described, e.g., in commonly-assigned co-pending U.S. patent application Ser. No. 10/719,041, entitled "SOLVENT VAPOR INFILTRATION OF ORGANIC MATERIALS INTO NANOSTRUCTURES" filed Nov. 21, 2003.

Alternatively, as described above, the second charge-transfer material may include fullerenes ($C_{60}$ and $C_{70}$ and the like), carbon nanotubes, dyes, ruthenium dyes, pigments, and organic monomers, oligomers, and polymers, any of which may be deposited singly or in combination into the porous template. These organic materials can be deposited using capillary action and or through osmotic gradients, using liquid solutions containing the materials to be deposited. In addition, carbon nanotubes can be synthesized directly within the template elements 303 or the tubule pores 302 using, for example, chemical vapor deposition (CVD).

In addition, the second charge-transfer material 309 may be an inorganic material deposited in the tubule pores by any of several suitable techniques including but not limited to sol-gel chemistry, spray pyrolysis, layer-by-layer deposition (LBL), evaporation, atomic layer deposition (ALD), plasma-enhanced atomic layer deposition (PECVD), chemical vapor deposition (CVD), metal-organic chemical vapor deposition (MOCVD), plasma enhanced chemical vapor deposition (PECVD), sputtering, and the like.

Figure 3F:
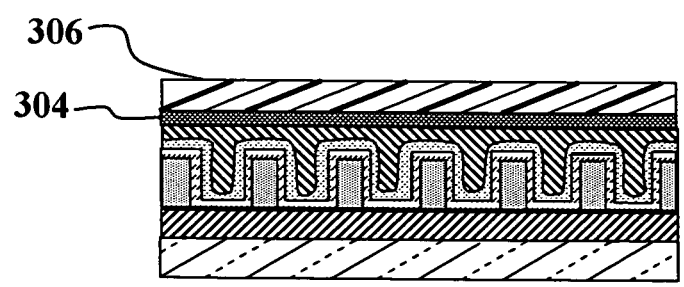

By way of example, and without loss of generality, the second charge-transfer material could be copper sulfide ($Cu_2S$), cadmium telluride (CdTe), zinc telluride (ZnTe), cadmium selenide (CdSe), zinc selenide (ZnSe), cadmium-tellurium selenide (CdTeSe), copper oxide ($Cu_2O$ or CuO), copper-indium selenide ($CdInSe_2$) or other materials with similar properties. The device can be finished as shown in FIG. 3F. An interlayer 304, e.g., a polymer such as PSS:PEDOT may optionally be deposited on top of the second charge-transfer material 309. An electrode in the form of a fine metal grid or thin metal film can then be added. The final device may be encapsulated to provide for mechanical stability and/or protection from the ambient environment. Alternatively, a thin metallic film or coating can be deposited or attached to the device to serve as an electrode.

V. Alternative Embodiments

Although in some of the embodiments listed above it is often implied that the first charge transporting materials (e.g. 108) and the bottom electrode (e.g. 110) assume the roles of electron-transporter/acceptor/collector and the second material (e.g. 109) assumes the role of the opposite positive charge carrier transporter/acceptor/collector and the TCE 106 assumes the role of an anode, it is clearly within the scope of this invention that this functional order could be reversed. For example, the base electrode 110 could be an anode. The first charge-transfer material 108 and/or interfacial layer 113 and or any additional conductive layers between the template 105 and first charge-transfer material 108 could act as positive charge carrier acceptors/transporters/collectors. The, e.g., organic (or inorganic) second charge-transfer material 109 could be a negative charge carrier acceptors/transporters/collectors, together with the TCE 106 and/or interface layer 104 serving as a cathode. This includes cases in which the template material itself (e.g. 105) has advantageous conductive and/or charge transfer properties. Another example would be one in which, e.g., the interfacial layer 113 is e.g. PEDOT/PSS (acting as anode that contacts down through the template pores to the base electrode 110) followed by e.g. a donor/acceptor organic blend filled into the pores or a bi-layer structure with a hole acceptor/transporter layer on top of the interfacial layer 113 with the remaining volume filled with an electron acceptor/transporter.

The devices described herein incorporate several advances over prior art devices. Specifically, the devices described herein are solid-state devices that do not contain a liquid electrolyte. Therefore, devices according to embodiments of the present invention are subject to significantly fewer leakage and corrosion problems of the type associated with devices using liquid electrolytes. Furthermore, the devices described herein have a charge splitting layer having with a more uniform and more tunable structure and/or function than prior art devices. In particular, the devices described herein have an active layer characterized by volumetrically interdigitating charge-transfer materials with regularly arrayed template elements having substantially uniform spacing within the plane of the active layer and substantially parallel orientation and uniform length perpendicular to the plane of the active layer. Thus, the charge-splitting layer exhibits a three-dimensional structure that is very regular along its length and width, but also along its depth.

In addition, the devices described herein do not depend entirely on a monolayer of a dye adsorbed to an n-type inorganic material as a light absorber. Instead, devices according to embodiments of the present invention typically use a p-type light absorber capable of absorbing light in the bulk of the material. Consequently, devices of the type describe herein absorb light more effectively on a volume basis and are more efficient in converting incident light to electrical energy. Although a dye may optionally be included in the devices described herein, a dye is not needed for the device to convert light into electrical energy, as is the case for dye-sensitized solar cells. Thus, the devices described herein are not "dye-sensitized".

In addition, devices of the type described herein may be made substantially thinner than prior art devices. For example, at about 2 microns thick, or substantially less, solar cell devices according to embodiments of the present invention may be significantly thinner than the typically 8-10 micron thick Graetzel cells or the typically 4-5 micron thick purely inorganic cells.

Furthermore, unlike cells comprised of sintered particles, the template-filler method of construction described herein is based on a substantially self-assembling template, that exhibits much greater long-range order.

Furthermore, the devices described herein do not use a liquid-based electrolyte or a "redox" chemistry to transport holes away from the light absorbing material. Instead, a p-type organic solid-state material transports holes from the charge splitting interface.

VI. Conclusion

Embodiments of the present invention allow for large-scale, low-cost production of photovoltaic devices, such as solar cells or other devices.

While the above includes a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. The appended claims are not to be interpreted as including means-plus-function or step-plus-function limitations, unless such a limitation is explicitly recited in a given claim using the phrase "means for" or "step for".

What is claimed is:

1. A photovoltaic device, comprising:
    an insulating inorganic nanostructured template having regular template elements between about 1 nm and about 500 nm in diameter with a structure density of between about $10^{12}$ elements/m² and about $10^{16}$ elements/m²;

a first charge-transfer material coating the nanostructured template material leaving additional space; and a second charge-transfer material filling the additional space, wherein the first and second charge-transfer materials are volumetrically interdigitated, wherein the first and second charge-transfer materials have complementary charge-transfer properties with respect to each other, wherein a lowest unoccupied molecular orbital (LUMO) or conduction band of the first charge-transfer material differs from a LUMO or conduction band of the second charge-transfer material by more than about 0.2 eV, wherein an absorbance of at least one charge transfer material is greater than about $10^3$/cm at the peak of absorption.

2. The device of claim 1, further comprising a base electrode and a transparent electrode, wherein the nanostructured template is disposed between the base electrode and transparent electrode.

3. The device of claim 2, wherein the first charge-transfer material is in electrical contact with the base electrode and the second charge-transfer material is in contact with the transparent electrode.

4. The device of claim 1 wherein the first and second charge transfer materials fill space between and/or within the template structures up to a level that is substantially even with an upper surface of the template.

5. The device of claim 1 wherein the first charge-transfer material is an n-type or p-type semiconductor.

6. The device of claim 1, further comprising a layer of functionalized $C_{60}$ covalently attached to the first charge-transfer material.

7. The device of claim 1 further comprising a layer of an electrically conductive material coating one or more walls of the template elements, the electrically conductive material being disposed between the nanostructured template and the first charge-transfer material.

8. The device of claim 7 wherein the electrically conductive material includes an inorganic material.

9. The device of claim 8 wherein the inorganic material includes copper sulfide and/or a conductive oxide.

10. The device of claim 9 wherein the conductive oxide is tin oxide (SnOx), indium oxide (InOx), fluorinated tin oxide (F:SnOx), indium tin oxide (ITO), tungsten oxide, titania (titanium oxide—$TiO_2$), zinc oxide (ZnO), zirconium oxide, lanthanum oxide, copper oxide, zirconium oxide, lanthanum oxide, niobium oxide, tungsten oxide, strontium oxide, calcium/titanium oxide, vanadium oxide, zirconium oxide, molybdenum oxide, or a blend or alloy of two or more of these materials.

11. The device of claim 7 wherein the electrically conductive material includes an organic material.

12. The device of claim 11 wherein the organic material includes one or more materials from the group of PLDOT: PSS, doped conjugated organic materials, or doped fullerenes, e.g., doped $C_{60}$.

13. The device of claim 7 wherein the first charge-transfer material is an n-type or p-type semiconductor.

14. The device of claim 7 wherein the first charge-transfer material is n-type doped.

15. The device of claim 7, further comprising a layer of functionalized $C_{60}$ covalently attached to the first charge-transfer material.

16. The device of claim 1, wherein the first charge-transfer material is amorphous silicon or hydrogenated amorphous silicon.

17. The device of claim 13 wherein the amorphous silicon is thicker at an upper portion of the nanostructured template and thinner at lower portion of the template.

18. The device of claim 16 wherein the amorphous silicon is a coating between about 1 nm and about 100 nm in thickness.

19. The device of claim 16 wherein the second charge-transfer material has a band gap that is less than about 2 eV.

20. The device of claim 16 wherein the amorphous silicon is n-type doped.

21. The device of claim 20, wherein the second charge-transfer material is a p-type material.

22. The device of claim 21, wherein a dominant negative charge carrier energy of the second charge-transfer material lies within 1 eV of the LUMO or conduction band of the first charge-transfer material and wherein a hole energy of the second charge-transfer material is above one or more valence band states of the first charge-transfer material.

23. The device of claim 22 wherein the dominant negative charge carrier energy level of the second charge-transfer material lies within 0.2 eV of the conduction band or LUMO states of the first charge-transfer material.

24. The device of claim 16 wherein the second charge transfer material is a thiophene, fluorine or aryl-vinyl based polymer, copolymer or blend.

25. The device of claim 1, wherein the first charge-transfer material includes a functionalized fullerene.

26. The device of claim 25 wherein the functionalized fullerene is $C_{60}$—COOH or PCBM.

27. The device of claim 1 wherein the first and second charge-transfer materials are blended together.

28. The device of claim 1 wherein the first and second charge-transfer materials are both organic materials.

29. The device of claim 1 wherein the one or more of the first, and second charge-transfer materials includes a material chosen from the group of thiophene-, fluorine- or aryl-vinyl-based polymers, copolymers or blends, poly(phenylene) and derivatives thereof, poly(phenylene vinylene) and derivatives thereof, poly(2-methoxy-5-(2-ethyl-hexyloxy)-1,4-phenylene vinylene (MLH-PPV), poly(para-phenylene vinylene) (PPV), PPV copolymers, poly(thiophene) and derivatives thereof, poly(3-octylthiophene-2,5,-diyl) regioregular, poly(3-octylthiophene-2,5,-diyl) regiorandom, poly (3-hexylthiophene) (P3HT), poly(3-hexylthiophene-2,5-diyl) regioregular, poly(3-hexylthiophene-2,5-diyl) regiorandom, poly(thienylenevinylene) and derivatives thereof, poly(isothianaphthene) and derivatives thereof, tetrahydro-thiophene precursors and derivatives thereof, polyphenylene-vinylene and derivatives, organometallic polymers, polymers containing perylene units, poly(squaraines) and their derivatives, discotic liquid crystals polyfluorenes, polyfluorene copolymers, polyfluorene-based copolymers co-polymerized and/or blended with charge transporting compounds, polyfluorene-based copolymers co-polymerized and/or blended with tri-phenyl-amines and derivatives, polyfluorene-based copolymers co-polymerized and/or blended with light-absorbing compounds, polyfluorene-based copolymers co-polymerized and/or blended with fused thiophene rings and derivatives, polyfluorene-based copolymers co-polymerized and/or blended with hetero-atom ring compounds with or without substituents, pigments, dyes, small molecules, or fullerenes.

30. The device of claim 1, wherein one or more of the first and second charge-transfer material is a pigment, dye or small molecule chosen from the group of organic pigments or dyes, azo-dyes having azo chromofores (—N═N—) linking aromatic groups, phthalocyanines including metal-free phthalocyanine; (HPc), Copper pthalocyanines (CuPc), Zinc Pthalocyanines (ZnPc), perylenes, perylene derivatives, pentacenes, pentacene derivates, pentacene precursors, naphthalocyanines, squaraines, merocyanines and their respective derivatives, poly(silanes), poly(germinates), 2,9-Di(pent-3-yl)-anthra[2,1,9-def:6,5,10-d'e'f']diisoquinoline-1,3,8,10-tetrone, and 2,9-Bis-(1-hexyl-hept-1-yl)-anthra[2,1,9-def:6,5,10-d'e'f']diisoquinoline-1,3,8,10-tetrone.

31. The device of claim 1 wherein the second charge-transfer material includes one or more materials chosen from the group of fullerenes, doped fullerenes, functionalized fullerenes, doped functionalized fullerenes, azafullerenes, polymerized fullerenes (doped or undoped), functionalized polymerized fullerenes (doped or undoped), carbon nanotubes, dyes, ruthenium dyes, pigments, organic monomers, oligomers, and polymers, tetra-hydro-thiophene precursor polymers and derivatives thereof, poly-phenylene-vinylene and derivatives thereof, conjugated polymers.

32. The device of claim 1 wherein the first charge-transfer material is an inorganic material.

33. The device of claim 32 wherein the first charge transfer material is cadmium sulfide, cadmium oxide, or copper oxide.

34. The device of claim 1 wherein the second charge transfer material is an inorganic material.

35. The device of claim 32 wherein the second charge transfer material is cadmium selenide, zinc selenide, cadmium telluride, zinc telluride, cadmium-tellurium selenide, copper-indium selenide, copper oxide or copper sulfide, or mixtures or alloys of two or more of these materials.

36. The device of claim 1 wherein both the first and second charge transfer materials are inorganic materials.

37. The device of claim 1 further comprising an interfacial layer disposed between the first and second charge-transfer materials.

38. The device of claim 37 wherein the interfacial layer includes one or more chemicals that can covalently attach to the first charge-transfer material and change a surface energy and/or bonding trap-states and/or attach to dangling-bonds at an exposed surface of the first charge-transfer material and/or introduce a dipole layer that may increase the efficiency for charge extraction and/or reduce detrimental charge recombination.

39. The device of claim 37 wherein the interfacial layer includes $C_{60}$, $C_{60}$—COOH, fullerenes other than $C_{60}$, phenyl-$C_{61}$-butyric acid methyl ester (PCBM), or $C_{60}$ or other fullerenes functionalized with a carboxylic acid moiety.

40. The device of claim 1, further comprising first and second electrodes, wherein the nanostructured template is disposed between the first and second electrodes.

41. The device of claim 40 wherein one or more of the first and second electrodes is transparent.

42. The device of claim 1 wherein the template elements are in the form of hollow tubes that protrude from the template with spaces between the sidewalls of the tubes.

43. The device of claim 1 wherein the template is made of aluminum oxide.

44. The device of claim 1 wherein the template elements include one or more elongated structures.

45. The device of claim 44 wherein the elongated structures include one or more tubes, pillars, needles, whiskers or elongated crystals protruding from a surface.

46. The device of claim 44 wherein the elongated structures include one or more openings, pores, or channels formed into or through a layer of material.

47. A photovoltaic device, comprising:
a base electrode;
a top electrode;
an insulating nanostructured template disposed between the base electrode and top electrode, wherein the nanostructured template in made of an insulating material, the nanostructured template having template elements between about 1 nm and about 500 nm in diameter with an elements density of between about $10^{12}$ elements /$m^2$ and about $10^{16}$ elements/$m^2$;
a first charge-transfer material coating the insulating nanostructured template in a way that leaves additional space; and
a second charge-transfer material in the additional space such that the first and second charge-transfer materials are volumetrically interdigitated, wherein a conduction band or lowest unoccupied molecular orbital (LUMO) of the first charge-transfer material differs from a conduction band or LUMO of the second charge-transfer material by more than about 0.2 eV, wherein an absorbance of at least one charge transfer material is greater than about $10^3$/cm at the peak of absorbance.

48. The device of claim 47 wherein the first charge-transfer material is amorphous silicon or hydrogenated amorphous Si.

49. The device of claim 47 further comprising a conductive coating on one or more walls of the template elements such that the conductive coating is disposed between the first charge-transfer material and the insulating nanostructured template.

50. The device of claim 47 further comprising an interface layer disposed between the second charge-transfer material and the top electrode.

51. The device of claim 50 wherein the interface layer includes a barrier layer, an organic material, or a conducting polymer.

52. The device of claim 47 wherein the first and second charge transfer materials do not extend significantly above a surface of the nanostructured template.

53. A method for making a photovoltaic device, comprising:
forming an insulating nanostructured template having template elements between about 1 nm and about 500 nm in diameter with a pore density of between about $10^{12}$ elements/$m^2$ and about $10^{16}$ elements/$m^2$;
coating one or more walls of the template elements with a first charge-transfer material in a way that leaves additional space; and
filling the additional space with a second charge-transfer material such that the first and second charge-transfer materials volumetrically interdigitate, wherein the second charge-transfer material has complementary charge-transfer properties with respect to the first charge-transfer material, wherein a lowest unoccupied molecular orbital (LUMO) or conduction band of the first charge-transfer material differs from a LUMO or conduction band of the second charge-transfer material by more than about 0.2 eV, wherein an absorbance of at least one charge transfer material is greater than about $10^3$/cm at a peak of absorbance.

54. The method of claim 53, further comprising coating one or more walls of the template elements with a conductive material before coating the walls of the template elements with the first charge-transfer material such that the conductive material is disposed between the insulating template and the first charge-transfer material.

55. The method of claim 53 wherein coating the walls of the template elements with the first charge-transfer material includes atomic layer deposition (ALD), plasma-enhanced atomic layer deposition, atomic vapor deposition, sputtering, chemical vapor deposition (CYD), metal-organic chemical vapor deposition (MOCYD), pulsed CYD, metal-organic-vapor-phase epitaxy, plasma enhanced chemical vapor deposition (PLC VD) electrochemical deposition, electroless (chemical bath) deposition, evaporation, sputtering, plating, ion-plating, molecular beam epitaxy, sol-gel based deposition, spray pyrolysis, vapor-phase deposition, solvent vapor deposition, metal-organic vapor phase deposition, metal-organic-vapor-phase epitaxy, self-assembly, electro-static self-assembly, melt-filling/coating, electro-deposition, electroplating, layer-by-layer (LBL) deposition, or liquid phase deposition.

56. The method of claim 53 wherein the first charge-transfer material is an n-type material and the second charge-transfer material is a p-type material.

57. The method of claim 53 wherein the first charge-transfer material includes a layer of amorphous silicon.

58. The method of claim 53 wherein filling the additional space includes putting the second-charge-transfer material in space not occupied by the first charge-transfer material.

59. The method of claim 53 wherein forming the nanostructured template includes anodizing a layer of metal.

60. The method of claim 59 further comprising coating the nanostructured template with a layer of conductive material.

61. The method of claim 60 wherein coating the nanostructured template with a layer of conductive material includes exposing to the template to a reducing agent to reduce an oxide material of a sidewall and/or base of the template elements to render the sidewall and/or base electrically conducting.

62. The method of claim 53 wherein forming the nanostructured template includes partially anodizing a layer of metal such that an anodized portion of the layer of metal becomes the template while an unanodized portion may act as an electrode.

63. The method of claim 62, further comprising removing a barrier layer at a bottom of one or more template structures.

64. The method of claim 62, further comprising forming a layer of conducting or semiconducting material at a bottom of one or more template structures.

* * * * *